United States Patent [19]
Imai et al.

[11] B 3,988,181
[45] Oct. 26, 1976

[54] METHOD OF DOPING A POLYCRYSTALLINE SILICON LAYER

[75] Inventors: Kabushiki Kaisha Suwa Seikosha, Tokyo, Japan

[73] Assignee: Kabushiki Kaisha Suwa Seikosha, Tokyo, Japan

[22] Filed: May 30, 1973

[21] Appl. No.: 365,371

[44] Published under the Trial Voluntary Protest Program on Jan. 28, 1975 as document No. B 365,371.

[30] Foreign Application Priority Data
June 7, 1972 Japan............................. 47-55993

[52] U.S. Cl............................. 148/188; 148/186; 148/187
[51] Int. Cl. ............................................ H01L 21/225
[58] Field of Search..................... 148/188, 187, 186

[56] References Cited
UNITED STATES PATENTS

| | | |
|---|---|---|
| 3,460,007 | 8/1969 | Scott............................. 148/188 X |
| 3,646,665 | 3/1972 | Kim................................ 148/187 X |
| 3,673,679 | 7/1972 | Carbajal et al. ................. 148/188 X |
| 3,690,968 | 9/1972 | Fa et al............................... 148/188 |

OTHER PUBLICATIONS

Kamins, "Hall Mobility in Chemically Deposited Polycrystalline Silicon," J. of Applied Physics, Vol. 42, No. 11, Oct. 1971, pp. 4357–65.

*Primary Examiner*—G. Ozaki
*Attorney, Agent, or Firm*—Blum, Moscovitz, Friedman & Kaplan

[57] ABSTRACT

An improved wafer type semiconductor may be fabricated by depositing an insulating film layer of predetermined thickness on a semiconductor substrate, preferably of silicon, depositing a substantially pure polycrystalline silicon layer of predetermined thickness on the insulating film layer, and thereafter depositing a doped oxide film layer of predetermined thickness on the substantially pure polycrystalline silicon layer, and effecting diffusion of the dopant into the pure polycrystalline silicon layer whereby a semiconductor wafer with a resistance of several megohms.cm is provided.

7 Claims, 9 Drawing Figures

METHOD OF DOPING A POLYCRYSTALLINE SILICON LAYER

BACKGROUND OF THE INVENTION

The instant invention relates to a novel wafer type semiconductor and a forming method therefor. More particularly, this invention relates to a semiconductor including a high resistance layer and wherein resistance layer formation is effected by selective diffusion from one wafer layer to another.

Prior wafer type semiconductor devices generally include a silicon substrate with successive layers of an insulating film and doped polycrystalline silicon deposited thereon. Conventional dopants for the polycrystalline silicon layer are $B_2H_6$ and $PH_3$.

There is a constant and chronic need for wafer type semiconductors with uniformly high resistances of several meg-ohms. cm and specific resistivities of several hundred thousand ohms/cc. Heretofore known doped polycrystalline silicon devices have not exhibited the uniform qualities desired.

Accordingly, this invention provides a wafer type semiconductor including a doped polycrystalline silicon layer which exhibits a uniformly high resistance and specific resistivity. Moreover, these wafer type semiconductors may be mass-produced with minimum variation between wafers and the resistance thereof.

SUMMARY OF THE INVENTION

Generally speaking, in accordance with the invention, a semiconductor wafer is provided which includes a silicon substrate and successive layers of an insulating film, substantially pure polycrystalline silicon and doped silicon dioxide. Preferred insulating layers include films of $SiO_2$, $Si_3N_4$ or $Al_2O_3$. Dopants which may be satisfactorily employed to dope the silicon dioxide film layer include $PH_3$ and $B_2H_6$. In an alternative wafer type semiconductor embodiment, the doped silicon dioxide film layer may be capped with a substantially pure oxide film.

The wafer type semiconductor may be fabricated by depositing an insulating film layer, preferably $SiO_2$, of predetermined thickness, and preferably of about 2,000 angstroms thick, on the semiconductor substrate, depositing a substantially pure polycrystalline silicon layer of predetermined thickness, and preferably 6,000 angstroms thick, on the insulating film layer, and thereafter depositing a doped oxide film layer, preferably doped with $PH_3$ or $B_2H_6$, of predetermined thickness, and preferably 4,000 angstroms thick, on the substantially pure polycrystalline silicon layer. The formed wafer is thermally treated whereby dopant migrates from the doped silicon dioxide film layer and diffuses into the substantially pure polycrystalline silicon layer thereby providing the semiconductor with a high resistance layer.

The inventive method provides wafer type semiconductor devices with uniformly high resistance and specific resistivity. Moreover, while layers of the wafer type semiconductor device are thermally treated to induce specie migration and diffusion, resistance and specific resistivity between devices will remain substantially uniform.

Still other advantages of the invention will in part be obvious and will in part be apparent from the specification.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1A:
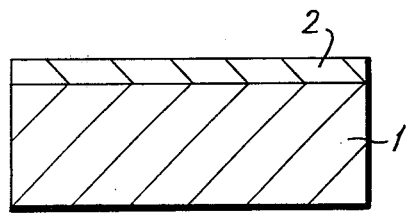
FIGS. 1a, 1b, and 1c are sectional views of successive stages in the manufacturing process for a conventional wafer type semiconductor device, as known to the art.
Figure 1B:
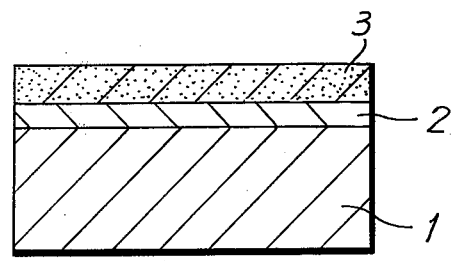
Figure 1C:
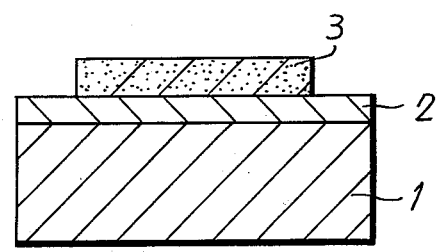

Referring now to FIGS. 1a, 1b, and 1c of the drawings, there are shown sequential stages for forming a conventional wafer type semiconductor. A doped polycrystalline silicon film 3 is deposited on a wafer substrate 1 with an insulating film layer 2 being interposed therebetween. The doped polycrystalline silicon film layer 3 is thereafter masked and etched, for instance by bathing the masked device in a selected etchant according to conventional techniques, thereby providing the device with a resistance layer, best seen in FIG. 1c.

In prior devices of the type shown, $B_2H_6$ or $PH_3$ has been employed as a dopant for the polycrystalline silicon film 3. Conventionally, a film of $SiO_2$, $Si_3N_4$ or $Al_2O_3$ may be deposited on substrate 1 to provide an insulating film layer therefore.

Prior devices of the type shown generally have erratic or lower than required resistance and specific resistivity. The less than satisfactory performance of these prior devices is attributable to their layered make-up, dopant concentration and process parameters.

We have now found that the concentration ratio between dopant, $B_2H_6$ or $PH_3$, and $SiH_4$ in the doped polycrystalline silicon layer remarkably influences the specific resistivity of the device. And extreme difficulty is encountered in controlling the deposited amount of each component. Usually, the doped polycrystalline silicon layer is deposited on the substrate in a high-frequency vertical heating furnace in the presence of a carrier stream with a make-up of 10 liters/minute $N_2$, 6 cc/minute $SiH_4$ and 10 cc/minute $PH_3$ with an $N_2$ base of 5 ppm. After deposition, the substrate is usually heat treated under a nitrogen blanket for about 15 minutes at a temperature of about 1,100° C. The heat treated device may have a specific resistivity which varies between about 5,000 to about 15,000 ohms/cc. Specific resistivity varies from device to device although each device is fabricated under the same processing conditions and parameters. It has been found, that specific resistivity may vary as much as one unit from device to device.

Figure 2:
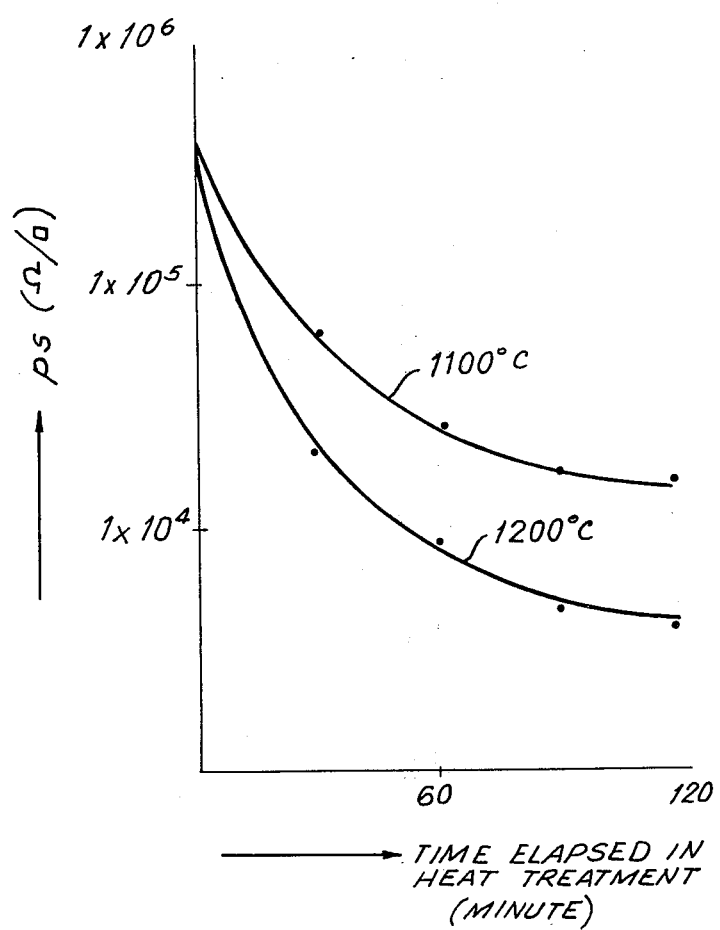
FIG. 2 is a graph which shows the relationship between specific resistivity and heat treatment conditions for the prior art device of FIG. 1c.

In addition, we have found that when the doped polycrystalline silicon layer is heat treated under a nitrogen blanket, the specific resistivity thereof varies widely with the temperature and length of the treatment, as best seen in FIG. 2. Therefore, we find it necessary to closely control the length and temperature of any heat treatment to which the device may be subjected after the doped polycrystalline silicon layer is deposited thereon.

Referring now to FIGS. 3a, 3b, 3c, and 3d of the drawings, there are shown sequential stages for forming a wafer type semiconductor according to the invention. On a silicon substrate 14, an $SiO_2$ film 15 of about 2,000 angstroms is deposited and provides therefor an insulating layer. A substantially pure polycrystalline silicon film 16 of about 6,000 angstroms is deposited thereon in the presence of $SiH_4$ and $N_2$ gas at a temperature of about 650° C. A doped oxide film 17, preferably doped with $B_2H_6$, of about 4,000 angstroms is next deposited thereon. The boron doped oxide film 17 may be deposited by heat treating the layered substrate at a temperature of about 330° C. in the presence of a carrier stream with a make-up of 30 liters/minute $N_2$, 40 cc/minute $O_2$, 10 cc/minute $SiH_4$, and 1,000 cc/minute $B_2H_6$ having a nitrogen base of 5 ppm.

Figure 3A:
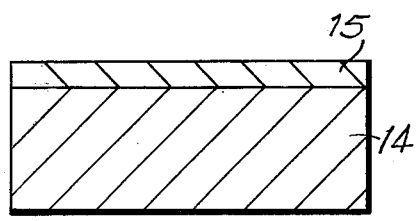
FIGS. 3a, 3b, 3c, and 3d are sectional views of a wafer type semiconductor device constructed in accordance with the invention at successive stages of its manufacture.
Figure 3B:
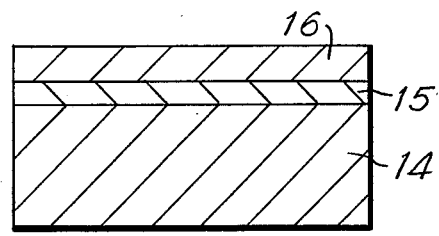
Figure 3C:
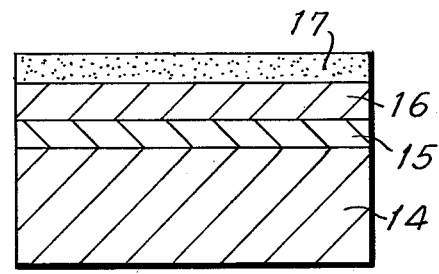
Figure 3D:
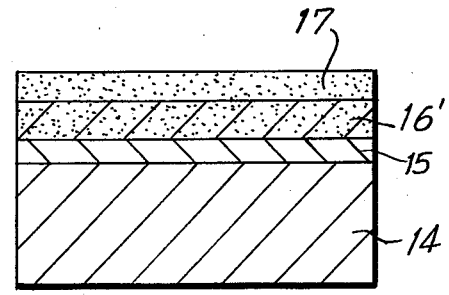
Figure 4:
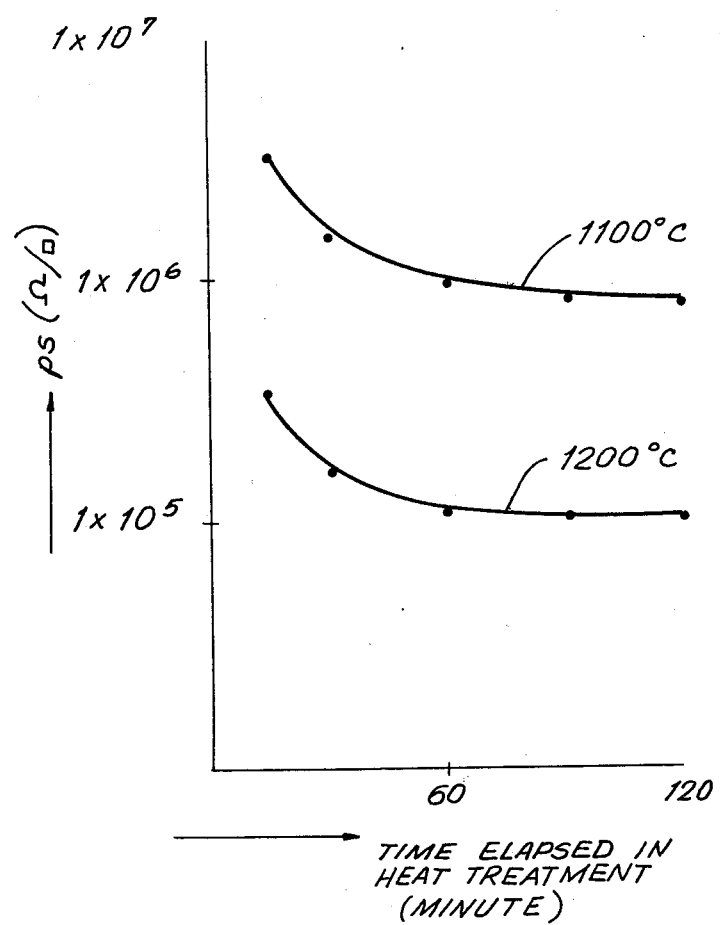
FIG. 4 is a graph which shows the relationship between the specific resistivity of the resistance layer of the inventive device and the conditions under which it is formed.

The layered substrate may be thermally treated under a nitrogen blanket whereby boron dopant migrates from layer 17 and diffuses into layer 16 thereby forming high resistance layer 16', best seen in FIG. 3d. Thermally treating the layered substrate causes migration and diffusion of dopant from layer 17 to layer 16, thereafter shown as resistance layer 16'. As best seen in FIG. 4, the dopant concentration of layer 16' is a function of temperature and time and specific resistivity of the semiconductor varies directly with the dopant concentration of layer 16'.

Specific resistivities from wafer to wafer and batch to batch vary only between about ± 20 percent when fabricated as described. Therefore, semiconductors with substantially uniform resistance and specific resistivities may be fabricated as described.

In an alternative embodiment, doped oxide film layer 17 may be capped with a substantially pure oxide film layer of about 2,000 to about 5,000 angstroms and thereafter thermally treated to diffuse the dopant after deposition of doped oxide film 17.

Either $B_2H_6$ or $PH_3$ may be used as the dopant for oxide layer 17. A wafer type semiconductor fabricated in the manner described has a resistance of several meg-ohms.cms. The inventive method affords means for controlling the dopant concentration of the resistance layer and provides devices with minimum variation in specific resistivity. Therefore the device may be mass-produced with minimum variation among devices.

It will thus be seen that the advantages set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. In a method for fabricating a wafer type semiconductor wherein an insulating layer and doped polycrystalline silicon layer are successively deposited on a semiconductor substrate, the improvement comprising depositing an insulating film layer of predetermined thickness on said semiconductor substrate, said insulating film completely overlying the deposition surface of said semiconductor substrate, depositing a substantially pure polycrystalline silicon layer of predetermined thickness on said insulating film layer, thereafter depositing a doped oxide film layer of predetermined thickness on said substantially pure polycrystalline silicon layer, and thermally treating said layered wafer to initiate dopant diffusion into said substantially pure polycrystalline silicon layer, whereby a high resistance semiconductor device with an accuracy of ± 20 percent to specification is formed.

2. The method of claim 1 wherein said dopant for said doped oxide film layer is $PH_3$ or $B_2H_6$.

3. The method of claim 1 wherein said insulating film layer comprises $SiO_2$.

4. The method of claim 1 wherein an insulating film layer of about 2,000 angstroms is deposited on said substrate.

5. The method of claim 1 wherein a doped oxide film layer of about 4,000 angstroms is deposited on said substantially pure polycrystalline layer in the presence of a carrier stream having a make-up of 30 liters/minute $N_2$, 40 cc/minute $O_2$, 10 cc/minute $SiH_4$, 1,000 cc/minute, and $B_2H_6$ having a nitrogen base of 5 ppm.

6. The method of claim 1 wherein a substantially pure polycrystalline silicon layer of about 6,000 angstroms is deposited on said insulating film layer in the presence of $SiH_4$ and $N_2$ at a temperature of about 650° C.

7. The method of claim 1 including capping said doped oxide film layer with a substantially pure oxide film layer of about 2,000 to about 5,000 angstroms thick and thereafter thermally treating said layered substrate.

* * * * *